United States Patent [19]

Beauducel et al.

[11] 4,378,527
[45] Mar. 29, 1983

[54] DEVICE FOR AMPLIFYING AND SAMPLING ANALOG SIGNALS

[75] Inventors: Claude Beauducel, Henouville; Jacques Cretin, Le Chesnay, both of France

[73] Assignees: Institut Francais du Petrole, Rueil-Malmaison; Compagnie Generale de Geophysique, Massy, both of France

[21] Appl. No.: 201,844

[22] Filed: Oct. 29, 1980

[30] Foreign Application Priority Data

Oct. 29, 1979 [FR] France ................ 79 26963

[51] Int. Cl.³ .......................................... H03G 3/20
[52] U.S. Cl. ................................. 330/86; 330/279; 330/282; 367/67
[58] Field of Search ............... 330/129, 133, 134, 279, 330/282, 86; 328/175; 367/65, 66, 67

[56] References Cited

U.S. PATENT DOCUMENTS 4,031,504  6/1977  Mioduski ...................... 330/86 X

*Primary Examiner*—James B. Mullins
*Attorney, Agent, or Firm*—Millen & White

[57] ABSTRACT

The device is adapted to sample and amplify with an optimum gain multiplexed analog signals. It comprises a chain of three interconnected amplifiers, the first of which has a gain of unity, the respective gains of the two others being selected in dependence on their output voltage as compared to a reference voltage. It also comprises three memorizing capacitors each of which is adapted to memorize the output voltage of a corresponding amplifier, and switches, actuated in accordance with the gain selection for each amplifier, to make the necessary connections for operating the chain of amplifiers with the selected gain.

8 Claims, 2 Drawing Figures

FIG.1

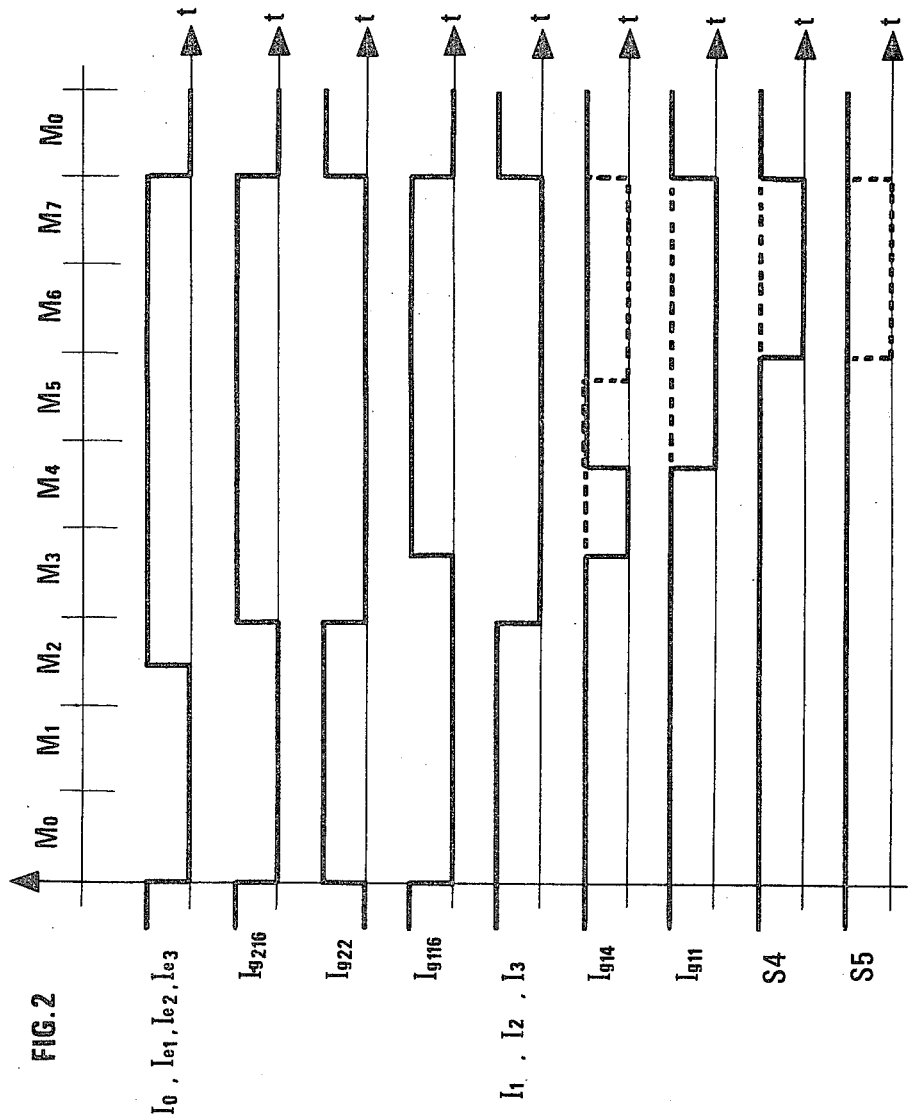

DEVICE FOR AMPLIFYING AND SAMPLING ANALOG SIGNALS

BACKGROUND OF THE INVENTION

This invention relates to a device for amplifying and sampling multiplexed analog signals of large dynamic range, i.e. whose level may vary to a large extent.

The device according to the invention is particularly adapted to be incorporated into a seismic data acquisition chain between a multiplexer and an analog-to-digital converter.

According to a known process, the seismic signals issued from each geophone of geophone group are directly supplied to the inputs of an analog multiplexer after a preliminary amplification in a preamplifier of fixed gain. The output of the multiplexer, where a sequence of signals is available, is connected to a single amplifier made up of a chain of amplification elements arranged in series, the output of each element being connected to the input of the next element. The gain of each amplification element is fixed and preferably selected as a whole power of number two.

Since the amplitude variation from a specific sample to the following one can be very high, a selection member is used to select the number of amplification units through which the signal is to pass in order to reach an optimum amplification level, and to switch the output of the amplification element where this signal is made available to the input of an analog-to-digital converter, which is connected to a recording system. According to a first embodiment of the prior art, described for example, in French Patent No. 2.110.758, all the amplification elements have an identical gain. According to another embodiment, the gains of the amplification elements differ from one another and have respective values which are the successive powers of number two.

An example of another prior art embodiment is described in the French Patent Application No. 2.373.914 which concerns an n-stage amplifier wherein the gain of any amplifier element is equal to the square of the gain of the preceding amplifier element.

The amplifiers formed of a series of serially interconnected amplifier elements suffer from numerous disadvantages:

they are relatively slow in view of the cumulative character of the delays which affect the signals having to pass through the different amplifier elements;

the effects of the relatively slow response of each amplifier element, when operated with pulses, characterized by its slew rate, accumulated over the whole chain of serially connected elements, tends to reduce the overall speed of the amplifier response;

the time the gain selector requires to select the output of the stage where the amplitude of the amplified sample is optimum, is in proportion of the length of the amplification chain;

when it is desired to increase the gain at each stage so as to shorten the amplification chain, it becomes necessary to make use of an analog-to-digital converter capable of processing longer digital words in order to obtain the same accuracy of the mantissa values;

It must be further observed that the amplifier elements are likely to saturate when a sample of low amplitude is followed with another one of substantially higher value.

A further disadvantage of the data acquisition chains having a head multiplexer results from the fact that, in order to memorize a sample value during the time required for the gain selection, it is necessary to make use of a memory element known in the art as sample-and-hold unit, connected before the amplifier and, accordingly, receiving signals in a wide dynamic range and which must therefore be capable of memorizing signals of high level as well as those of low level.

However, it is known that the sample-and-hold units available in practice have the disadvantage of not being capable of successively memorizing two samples without interaction of one sample with the other (i.e., the crosstalk phenomenom) so that the memorized value of the amplitude of a sample is accordingly not independent from the memorized value of the amplitude of the preceding sample.

Errors due to crosstalk being applied to the input of an amplifier, are likely to be amplified with a gain factor equal to the maximum gain of the amplification chain. Moreover the sample-and-hold units generally consist of a memorizing capacitor and two intermediate amplification elements forming a buffer, which make the amplification chain longer.

Accordingly, five to six amplification elements at least are required to form the amplifier.

SUMMARY OF THE INVENTION

The device according to this invention avoids the above-mentioned disadvantages. It comprises a continuous chain of several serially interconnected amplification elements whose gains have predetermined values. It is remarkable in that it comprises capacitors adapted to memorize the output voltages of all the amplification elements, switching means for modifying the gains of the amplification elements, for intermittently delivering the output voltages of all the amplification elements respectively to the terminals of the memorizing capacitors and for selectively feeding the input of the continuous chain of amplification elements with the voltages memorized in said capacitors, and selector means adapted to compare the output voltages of several amplification elements with a reference voltage and to control the switching means so as to select an optimum gain for the amplification elements.

Preferably, the device comprises three serially interconnected amplification elements, the first of which has a gain of one, whereas the gains of the two other elements have at least two predetermined values different from one. Moreover, the selector means comprises two comparators respectively connected to the outputs of the second and the third amplification elements and a selection member for selecting the optimum gain values to apply to the memorized voltages.

The device according to the invention thus performs the two functions of a variable gain amplifier and a sample-and-hold unit with the use of small number of a amplification elements, advantageously limited to three.

The disadvantages of the serial interconnection of the amplification elements are thus reduced to a minimum. Moreover, since the memorizing capacitors are arranged between the successive stages and are selectively connected to the input of the chain of amplification elements, the maximum gain applied to the error voltage, which systematically affect the memorized voltages, is much lower than that applied to the same error voltage in data acquisition chains provided at their head with a sample-and-hold unit, as more precisely stated below.

BRIEF DESCRIPTION OF THE DRAWING

Other features of the device will be made apparent from the following description of a particular non-limitative embodiment of the invention, given with reference to the accompanying drawings wherein:

FIG. 2 shows chronograms of signals controlling the different switches used for operating the device, said signals being generated during successive test cycles subdivided into seven time intervals $M_0, M_1 \ldots M_7$.

DETAILED DISCUSSION OF THE INVENTION

Figure 1:
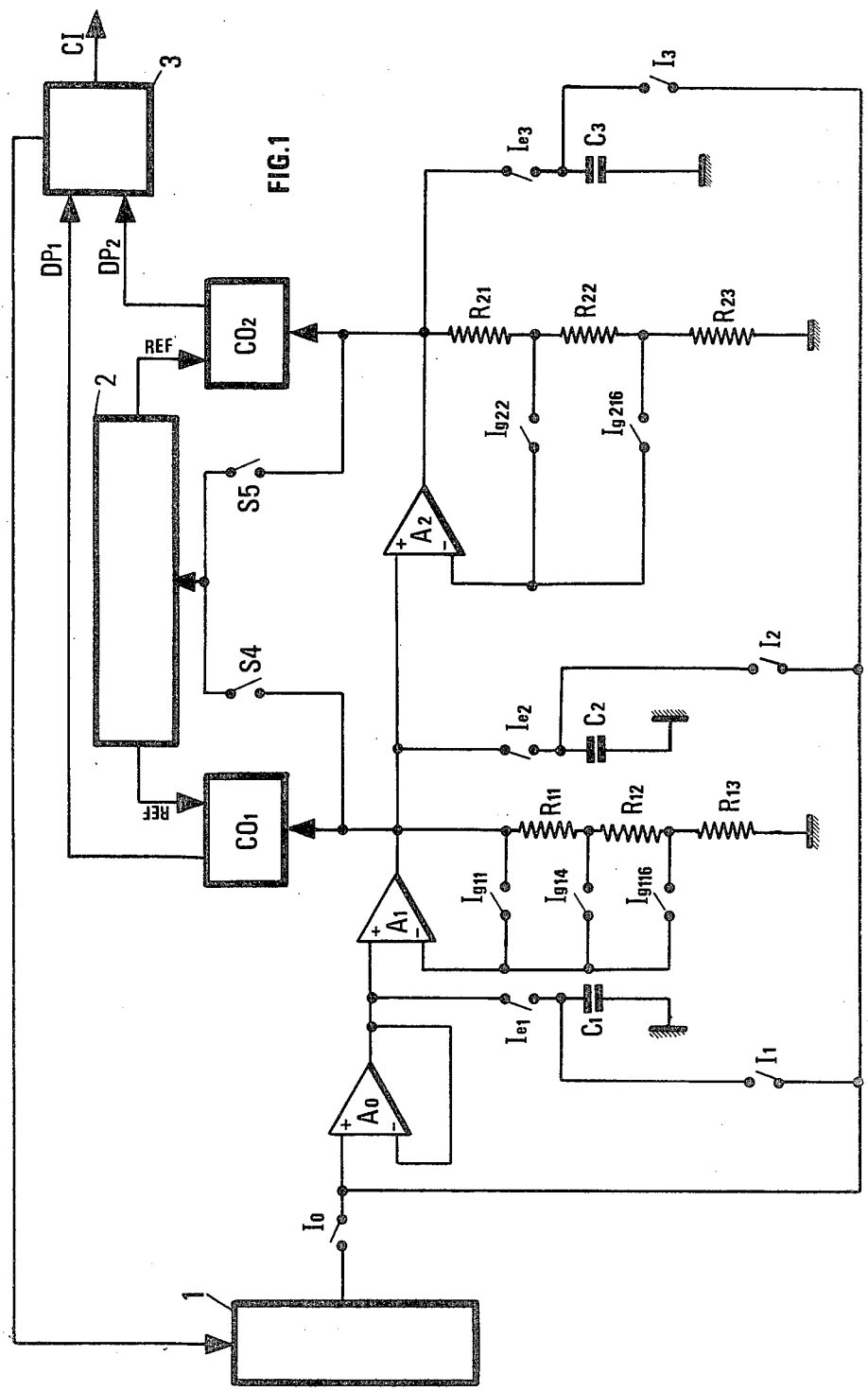
FIG. 1 diagrammatically shows the assembly of the amplification elements, the memorizing capacitors and the switching and selector means of the preferred embodiment.

The signal amplification and sampling assembly is connected, for example, to the output of a multiplexer 1 (FIG. 1) through an electronic switch $I_0$. This assembly comprises a first amplification element consisting of an operational amplifier forming a buffer, $A_0$, having a gain of unity. Its non-inverting input is connected to switch $I_0$ and its output is connected, on the one hand, to the non-inverting input of a second amplification element consisting of an operational amplifier $A_1$ and, on the other hand, to a first terminal of a first memorizing capacitor $C_1$ through an electronic switch $Ie_1$, the second terminal of this capacitor being earthed grounded. The output of amplifier $A_1$ is grounded through three serially connected resistors $R_{11}$, $R_{12}$ and $R_{13}$. The inverting input of amplifier $A_1$ is connected to the output thereof through an electronic switch $Ig_{11}$, to the junction point of resistors $R_{11}$ and $R_{12}$ through an electronic switch $Ig_{14}$, and to the junction point of resistors $R_{12}$ and $R_{13}$ through and electronic switch $Ig_{116}$. The three resistors $R_{11}$, $R_{12}$, $R_{13}$ and the three switches $Ig_{11}$, $Ig_{14}$ and $Ig_{116}$ form a conventional feed-back network, whereby the amplifier $A_1$ may be given a gain of unity, four or sixteen. The output of amplifier $A_1$ is connected to a first terminal of a capacitor $C_2$ through an electronic switch $Ie_2$, the second terminal of said capacitor being grounded. The output of amplifier $A_1$ is also connected to the non-inverting input of an operational amplifier $A_2$ forming the third amplification element, whose output is grounded through three serially connected resistors $R_{21}$, $R_{22}$, $R_{23}$. The inverting input of amplifier $A_2$ is connected to the junction point of resistors $R_{21}$ and $R_{22}$ through an electronic switch $Ig_{22}$ and to the junction point of resistors $R_{22}$ and $R_{23}$ through an electronic switch $Ig_{216}$.

Similarly, resistors $R_{21}$, $R_{22}$, $R_{23}$ and switches $Ig_{22}$ and $Ig_{216}$ form a feed back network adapted to operate the amplifier $A_2$ with a gain of two or sixteen. The output of amplifier $A_2$ is also connected to a first terminal of a memorizing capacitor $C_3$ through a switch $Ie_3$, the second terminal of said capacitor being grounded. The respective first terminals of the memorizing capacitors $C_1$, $C_2$, $C_3$ are respectively connected to the non-inverting input of amplifier $A_0$, forming a buffer, through switches $I_1$, $I_2$ and $I_3$. The outputs of amplifiers $A_1$ and $A_2$ are respectively connected, on the one hand, to the input of an analog-to-digital converter 2 through electronic switches $S_4$ and $S_5$ and, on the other hand, to selector means formed of two logic comparator elements $CO_1$ and $CO_2$ and of a selection member 3. The comparator elements are adapted to compare the amplitude of the amplifier elements with a reference voltage REF supplied by the analog-to-digital converter 2 and to produce comparison signals $DP_1$ and $DP_2$ whose amplitudes respectively correspond to logic levels 0 or 1 when the amplitudes of the samples are respectively lower or higher than the reference voltage.

The outputs of the logic comparator elements $CO_1$ and $CO_2$ are connected to the inputs of the selection member 3 which is adapted to generate the signals CI for controlling the electronic switches and the multiplexer in accordance with the logic level of signals $DP_1$ and $DP_2$.

The assembly of the switches forms the switching means.

The operation, as described below, of the amplifying and sampling assembly controlled by its selection member 3, is illustrated by the chronograms of FIG. 2, wherein the upper level corresponds to the switching off (opening) time of the switches and the lower level to their switching on (closure) time. It comprises essentially:

a first sampling step wherein the memorizing capacitors $C_1$, $C_2$, $C_3$ are respectively fed with voltages corresponding to the input voltage amplified with respective gains of 1, 16 and 256.

a second step of memorizing and selectively supplying one of the memorized voltages to the input of the chain of amplifier elements. During this second step, the gain to be applied by the second and the third of these elements is selected so as to obtain the optimum output voltage compatible with the maximum level required by the following elements (i.e., the analog-to-digital converter).

The operation of the device may be explained more in detail as follows:

The multiplexer is switched on the selected reception channel;

The switches $I_1$, $I_2$, $I_3$, $Ig_{11}$, $Ig_{14}$, $Ig_{22}$ remaining in off position, the switches $I_0$, $Ie_1$, $Ie_2$, $Ie_3$, $Ig_{116}$ and $Ig_{216}$, are switched on (closed). The amplitude of the sample is memorized in capacitor $C_1$ with a gain of unity and in capacitor $C_2$ with a gain of 16. The sample, subjected to a double amplification in amplifiers $A_1$ and $A_2$, is memorized in capacitor $C_3$ with a gain of $16^2 = 256$;

The switches $Ie_1$, $Ie_2$, $Ie_3$ and $I_0$ are switched off (opened), the other switches remaining in their preceding position, so as to hold or memorize the different amplified values of the sample and, simultaneously, the values of $DP_1$ and $DP_2$ at the end of the sampling period are noted. Three cases may occur:

(a) If $DP_1$ and $DP_2$ correspond to the logic level 1, the gain value $G = 16$ imparted to amplifier $A_1$ by switching on $Ig_{116}$, and obviously also the gain value $G = 256$ imparted to the pair of serially connected amplifiers $A_1$ and $A_2$, by switching on $Ig_{216}$, are too high. In that case $I_1$ is switched off so as to apply the voltage memorized in capacitor $C_1$ to the non-inverting input of the amplifier $A_0$.

(b) If $DP_1$ and $DP_2$ respectively correspond to logic levels 0 and 1, $I_2$ is switched on in order to apply the voltage memorized in capacitor $C_2$ to the non-inverting input of the buffer amplifier $A_0$.

If both of $DP_1$ and $DP_2$ correspond to the logic level 0, $I_3$ is switched on in order to apply the voltage memorized in capacitor $C_3$ to the non-inverting input of the buffer amplifier $A_0$.

Simultaneously, one of the switches $I_1$, $I_2$ and $I_3$ is switched on, $Ig_{216}$ is switched off and $Ig_{22}$ is switched on, thereby giving to the amplifier $A_2$ a gain of two. The gain of sixteen of amplifier $A_1$ remains unchanged ($Ig_{116}$ remains in the on position).

Subsequently, the output of amplifier $A_1$ or $A_2$ to be connected to the analog-to-digital converter is selected according to the following tests:

(a) If $DP_1$ corresponds to the logic level 0, the gain of 16 of amplifier $A_1$ is maintained ($Ig_{116}$ in the on position);

(b) If $DP_1$ corresponds to the logic level 1, the gain of amplifier $A_1$ is decreased from the value 16 to the value 4 by switching off $Ig_{116}$ and switching on $Ig_{14}$.

(c) If $DP_1$ still corresponds to the logic level 1, the gain of amplifier $A_1$ is further decreased from the value 4 to the value 1, after a certain waiting delay required for stabilizing the gain, by switching off $Ig_{14}$ and switching on $Ig_{11}$.

Once the preceding selection has been effected, the following steps are performed in accordance with the value of $DP_2$:

1° If $DP_2$ corresponds to the logic level 1, $S_4$ is switched on, thereby connecting the output of amplifier $A_1$ to the input of the analog-to-digital converter 2.

2° If $DP_2$ corresponds to the logic level 0, $S_5$ is switched on, thereby connecting the output of amplifier $A_2$ to the converter 2.

In both cases, the digitization of the sample is performed with the gain selected after all the tests have been made.

It is observed:

On the one hand, that the two-stage procedure with the application at the inlet of the amplification chain of a voltage previously amplified by a factor of at most 256 makes it possible to obtain a maximum amplification gain of $256^2$ by making use of only two amplification elements whose maximum gain is at most 16;

On the other hand, that, by conducting a small number of tests, it is possible to operate the assembly of the three interconnected amplification elements with any gain value which is a power of two, in the range from $2^0$ to $2^{16}$;

and that any error in the value of the voltage, memorized in one of the memorizing capacitors $C_1$, $C_2$ or $C_3$ and applied to the input of the first element $A_0$, is amplified, in the most unfavorable case, by a factor of 256 which is the maximum gain of the two serially interconnected elements $A_1$ and $A_2$, whereas, according to the prior systems, this error may be amplified by a factor corresponding to the maximum gain of the amplification chain ($2^{16}$ in the present case) since the sample-and-hold unit is placed at the head of the chain.

It would not be outside the scope of the invention to replace some elements of the device by equivalent elements. The electronic switches, for example, may obviously be replaced by any other elements performing the same function.

What is claimed is:

1. An amplification and sampling device adapted for amplifying multiplexed analog signals from multiplexing means to an optimum gain level for further operations to be preformed therewith, said device comprising:

a continuous chain of a plurality of amplification elements of respectively predetermined fixed gain interconnected in series with said multiplexing means connected to the input thereof;

a respective plurality of capacitor means, each one associated with the respective outputs of each amplification element of said plurality for storing the voltages at the respective outputs of said plurality of amplification elements;

first switch means arranged for adjusting the total gain of said continuous chain of a plurality of amplification elements;

second switch means for intermittently applying the output voltage of each of said plurality of amplification elements to its respectively associated capacitor means;

third switch means for selectively applying the voltages stored in one of said capacitors to the input of said continuous chain of a plurality of amplification elements; and gain selecting means operatively associated with said first, second, and third switch means for selecting an optimum gain for each analog signal being amplified, and including control means for controlling operation of said first, second, and third switch means for amplifying each analog signal to its optimum level by means of a two-stage amplification cycle.

2. A device according to claim 1, wherein said continuous chain comprises three amplification elements interconnected in series, the gains of the second element and of the third element having at least two predetermined gain values different from a gain of one and wherein said gain selecting means comprises two comparators, respectively connected to the outputs of said second and said third amplification elements, and a selection member for selecting the optimum gain values to be applied to the stored voltages.

3. A device according to claim 2, wherein said predetermined values of the gains of said second and said third amplification elements are selected from successive powers of two.

4. A device according to claim 3, wherein said second and said third amplification elements comprise feedback networks, and said first switch means comprises switches controlled by said gain selecting means associated with said feedback networks, for adjusting the gain of said second amplification element to a value of $2^0$, $2^4$ or $2^{16}$, and for adjusting the gain of said third amplification element to a value of $2^2$ or $2^{16}$.

5. A device according to claim 1, further comprising fourth switch means controlled by said gain selecting means, for connecting the output of one of said amplification elements to an apparatus for processing the amplified signals.

6. An amplification and sampling device adapted for amplifying multiplexed analog signals from a multiplexing means to an optimum gain level for further operations to be performed therewith, said device comprising:

a chain of M serially permanently interconnected amplification elements, the first of said chain having a fixed gain value, and each of the others of said chain having plural gain values, and having said multiplexing means connected to the input thereof;

respective plurality of capacitor means, each one associated with the respective outputs of each amplification element for storing the voltages at the outputs of respective ones of said plurality of amplification elements;

first switch means associated with the other amplification elements of said chain for adjusting the respective gains thereof;

second switch means for intermittently applying the output voltages from each of said amplification elements to respective ones of said capacitor means;

third switch means for selectively applying the voltages stored in said respective capacitor means to the input of said chain; and selecting means for selecting the optimum gain value for the analog signals, and including control means for controlling the operation of said first, second and third switch means whereby any multiplexed analog signal is amplified to an optimum gain level by means of a double stage amplification cycle.

7. A method for operating an amplification and sampling device adapted for applying an optimum amplification gain to multiplexed analog signals supplied by multiplexing means and the device comprising a continuous amplification chain of several serially and permanently interconnected amplification elements, said amplification chain being capable of having a plurality of different predetermined gain values upon actuation of first switching means, capacitor means for storing the voltages available at the outputs of all the amplification elements of the chain upon actuation of second switching means, third switching means for applying selected memorized voltages to the input of the amplification chain, comparing means for comparing the output voltages of the amplification elements to reference voltages and selecting means capable of actuating said first, second and third switching means, said method comprising the steps of conducting a first amplification with the amplification chain given a predetermined overall gain, sampling the output voltages of the different amplification elements for applying the voltages to the corresponding capacitor means, first comparing and selecting of the stored voltages in the capacitor means and applying a selected one of the stored voltages to the input of the amplification chain through the third switching means, and conducting a second comparing and selecting step for applying a selected one of the once again amplified stored voltages to an apparatus for processing the amplified signal from the amplification and sampling device.

8. A method for operating an amplification and sampling device adapted for applying an optimum amplification gain to multiplexed analog signals supplied by multiplexing means and the device comprising a continuous amplification chain of M serially and permanently interconnected amplification elements, the first of the amplification elements having a fixed gain and the others being capable of having a plurality of different predetermined gain values upon actuation of first switching means, capacitor means for storing the voltages available at the outputs of all the amplification elements of the chain upon actuation of second switching means, third switching means for applying selected stored voltages to the input of the amplification chain, comparing means for comparing the output voltages of the amplification elements to reference voltages and selecting means capable of actuating said first, second and third switching means, said method comprising the steps of conducting a first amplification step with the gains of the other amplification elements given a predetermined value, sampling the output voltages of the different amplification elements for applying the voltages to the corresponding capacitor means, first comparing and selecting of the stored voltages in the capacitor means and applying a selected one of the stored voltages to the input of the amplification chain through the third switching means, and conducting a second comparing and selecting step for applying a selected one of the once again amplified stored voltages to an apparatus for processing the amplified signal from the amplification and sampling device.

* * * * *